United States Patent
Krakowski (10) Patent No.: US 8,509,358 B2
(45) Date of Patent: Aug. 13, 2013

(54) VITERBI EQUALIZATION WITH DETECTION OF THE NEAREST CONSTELLATION POINTS FOR STAGE REDUCTION

(75) Inventor: Claudiu Krakowski, Groebenzell (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 664 days.

(21) Appl. No.: 12/677,391

(22) PCT Filed: Aug. 22, 2008

(86) PCT No.: PCT/EP2008/006931
§ 371 (c)(1),
(2), (4) Date: Mar. 10, 2010

(87) PCT Pub. No.: WO2009/059653
PCT Pub. Date: May 14, 2009

(65) Prior Publication Data
US 2010/0195768 A1 Aug. 5, 2010

(30) Foreign Application Priority Data
Nov. 7, 2007 (DE) .......................... 10 2007 053 091

(51) Int. Cl.
*H04L 27/06* (2006.01)
(52) U.S. Cl.
USPC ........... 375/341; 375/219; 375/229; 375/233; 375/261; 375/262; 375/279; 375/295; 375/298; 375/308; 375/316; 375/324; 375/329; 375/340; 375/346; 455/91; 455/296; 455/324; 455/501; 370/335; 370/342; 714/794; 714/795; 714/796; 327/551; 329/304

(58) Field of Classification Search
USPC ................. 375/219, 229, 233, 261, 262, 279, 375/295, 298, 308, 316, 324, 329, 340, 341, 375/346; 455/91, 296, 324, 501; 370/335, 370/342; 714/794, 795, 796; 327/551; 329/304
See application file for complete search history.

(56) References Cited

U.S. PATENT DOCUMENTS

| 3,872,432 A | 3/1975 | Bismarck |
| 4,077,021 A | 2/1978 | Csajka et al. |

(Continued)

FOREIGN PATENT DOCUMENTS

| CH | 609 510 A5 | 2/1979 |
| DE | 44 27 831 A1 | 2/1996 |

(Continued)

OTHER PUBLICATIONS

International Preliminary Report on Patentability, PCT/EP2008/006931, Jun. 10, 2010, pp. 1-11.

(Continued)

*Primary Examiner* — Leon Flores
(74) *Attorney, Agent, or Firm* — Ditthavong Mori & Steiner P.C.

(57) ABSTRACT

The device is used for decoding convolution-encoded reception symbols. In this context, transmission data are modulated with a modulation scheme to form symbols, which are encoded with a transmission filter to form convolution-encoded transmission symbols. A convolution-encoded transmission symbol contains components of several symbols arranged in time succession. These transmission symbols are transmitted via a transmission channel and received as reception symbols. The Viterbi decoder decodes the reception symbols by use of a modified Viterbi algorithm. Before running through the Viterbi decoder, the reception symbols are processed by a state-reduction device, which determines additional items of information relating to possible consequential states of the decoding independently of the decoding through the Viterbi decoder in every state of the decoding. The state-reduction device uses the additional items of information to restrict the decoding through the Viterbi decoder to given consequential states.

16 Claims, 12 Drawing Sheets

(56) References Cited

U.S. PATENT DOCUMENTS

| | | | |
|---|---|---|---|
| 6,119,264 A * | 9/2000 | Berrou et al. | 714/786 |
| 6,151,370 A | 11/2000 | Wei | |
| 6,353,913 B2 * | 3/2002 | Huttunen | 714/796 |
| 2003/0063681 A1 | 4/2003 | Olivier | |
| 2003/0099311 A1 | 5/2003 | Klingenbrunn et al. | |
| 2005/0268211 A1 | 12/2005 | Haratsch | |

FOREIGN PATENT DOCUMENTS

| | | |
|---|---|---|
| DE | 199 48 373 A1 | 5/2001 |
| EP | 0 688 110 A2 | 12/1995 |
| WO | WO 99/49634 A2 | 9/1999 |

OTHER PUBLICATIONS

European Search Report for European Patent Publication No. 0688110, date of publication Dec. 20, 2000, pp. 1-3.

Foschini, "A Reduced State Variant of Maximum Likelihood Sequence Detection Attaining Optimum Performance for High Signal-to-Noise Ratios", IEEE Transactions on Information Theory, vol. IT-23, No. 5, Sep. 1977, pp. 1-5.

International Search Report, WO 2009/059653 A1, Dec. 8, 2008, pp. 35-40.

* cited by examiner

VITERBI EQUALIZATION WITH DETECTION OF THE NEAREST CONSTELLATION POINTS FOR STAGE REDUCTION

CROSS-REFERENCE TO RELATED APPLICATIONS

The present application is a national phase application of PCT Application No. PCT/EP2008/006931, filed on Aug. 22, 2008, and claims priority to German Application No. 10 2007 053 091.0, filed on Nov. 7, 2007, the entire contents of which are herein incorporated by reference.

BACKGROUND OF THE INVENTION

1. Field of the Invention

The invention relates to a method and a device for decoding convolution-encoded signals, in particular, reception signals in mobile telephony and radio telephony.

2. Discussion of the Background

A decoder based upon the Viterbi algorithm is conventionally used for decoding convolution-encoded signals. In the case of convolution-encoded signals, the data to be transmitted correspond to the states of a "hidden Markov" model. The actually-transmitted data correspond to the state transitions in the model. From the visible state transitions, inferences are drawn through the Viterbi algorithm regarding the states at every timing point. For this purpose, a metric is determined, which, with a given reception symbol, indicates the probability of every state transition from every possible present state to every possible following state. Accordingly, the Euclidean distance of the present reception symbol to the symbols of the state transitions is determined. In this context, each individual state transition is described as a branch or a bough. A path is formed by connecting the individual branches in a sequence. The metric of the path is obtained by summation of the individual branch metrics.

The optimum path and therefore the most probable sequence of transmission symbols are given by the path of minimum metric. In the case of convolution-encoded signals, every reception symbol contains components of a plurality of symbols arranged in time succession. This is referred to as the memory of the code. Accordingly, the influence of a past reception symbol on the present state is limited. After a given number of reception symbols, any influence of the past reception symbol on the present state is no longer determinable. After the passage of this given number of reception symbols, the number of the paths, which enter the further calculation, is reduced to the most probable path. This step is referred to as the elimination of improbable paths. With this procedure, an optimum receiver for the convolution-encoded signal is provided.

For example, a device for synchronisation in a Viterbi decoder and therefore also its function are shown in U.S. Pat. No. 3,872,432 B1.

However, one disadvantage of the Viterbi algorithm is the marked dependence of the processing cost upon the parameters of the convolution-encoded signal. Accordingly, the cost rises very steeply with a large number of modulation stages and also with a long code memory.

Alternatively, convolution-encoded signals are decoded with the use of "minimum mean-square-error decision-feedback equaliser" (MMSE-DFE) decoders. Directly upon receipt of the symbol, these decoders finally determine the present state from the past reception symbols, without taking future reception symbols into consideration.

An MMSE-DFE decoder is shown in DE 199 48 373 A1.

These decoders in fact resolve the problem of the high processing cost of the Viterbi decoder, however, they provide a substantially reduced detection security. For example, especially in the case of strongly-disturbed transmission channels, a high bit-error rate of the reception signal is achieved.

SUMMARY OF THE INVENTION

Embodiments of the invention therefore provide a method and a device for decoding convolution-encoded signals, which requires a low processing cost while providing a good detection security.

A Viterbi decoder is used for the decoding of convolution-encoded reception symbols. In this context, transmission data are modulated with a modulation scheme to form symbols, which are encoded with a transmission filter to form convolution-encoded transmission symbols. A convolution-encoded transmission symbol contains components of several symbols arranged in time succession. These transmission symbols are transmitted via a transmission channel and received as reception symbols. The Viterbi decoder decodes the reception symbols by means of a modified Viterbi algorithm. Before running through the Viterbi decoder, the reception symbols are processed by a symbol-reduction device, which, independently of the decoding by the Viterbi decoder, in every state of the decoding, determines additional items of information, relating to possible consequential states of the decoding. The symbol-reduction device uses the additional items of information relating to possible consequential states of the decoding in order to limit the decoding through the Viterbi decoder to given consequential states. By reducing the possible consequential states, the processing cost is significantly lowered. At the same time, a high level of detection accuracy is achieved, because the most probable consequential states are selected as possible consequential states.

Advantageously, the symbol-reduction device obtains the additional knowledge relating to possible consequential states by determining an inter-symbol, interference-free, present reception symbol. By preference, it obtains the inter-symbol, interference-free, present reception symbol through weighted subtraction of past inter-symbol, interference-free reception symbols from the present reception symbol. The symbol-reduction device advantageously determines the consequential states by determining the states of minimum Euclidean distance to the inter-symbol, interference-free, present reception symbol. Accordingly, a series of possible consequential states can be determined with high security. The processing cost is very low.

The modulation scheme is preferably a phase modulation (PSK), and the symbol-reduction device preferably limits the further decoding to two given consequential states. The limitation to two consequential states reduces the processing cost particularly strongly.

The modulation scheme is advantageously an 8-stage phase modulation (8-PSK) or a 16-stage phase modulation (16-PSK). Reduction of the processing cost for decoding signals, which are modulated with a plurality of modulation schemes, is possible.

The modulation scheme is preferably a quadrature-amplitude modulation (QAM) and the symbol-reduction device preferably limits the further decoding to four given consequential states. With a high transmission rate, a significant reduction of the processing costs is achieved at the same time.

The modulation scheme is preferably a 16-stage or 32-stage or 64-stage quadrature-amplitude modulation.

Reduction of the processing cost for decoding signals, which are modulated with a plurality of modulation schemes, is possible.

In every state of decoding with the Viterbi algorithm, the Viterbi decoder preferably determines at least one path, which gives the correct sequence of transmission symbols with a low probability and preferably eliminates this at least one path from the further decoding. Accordingly, the processing cost for the decoding is further reduced. The security of the detection in this context is not substantially reduced.

A filter preferably filters the reception symbols before decoding. Filtering through the filter preferably reduces the influence of past symbols on the convolution-encoded reception symbol and preferably increases the influence of the present symbol on the convolution-encoded reception symbol. Accordingly, the security of the determined consequential states is increased. At the same time, the additional processing cost is very low.

The coefficients of the filter and the weighting factors for determining the inter-symbol, interference-free, present reception symbols are preferably determined by optimization. Accordingly, optimal filter coefficients and weighting factors are determined.

BRIEF DESCRIPTION OF THE DRAWINGS

By way of example, the invention is described below with reference to the drawings, in which an advantageous exemplary embodiment of the invention is presented. The drawings are as follows.

DETAILED DESCRIPTION OF EXEMPLARY EMBODIMENTS OF THE INVENTION

The structure and functioning of the hitherto-conventional Viterbi decoder is initially illustrated with reference to FIGS. 1-2. The structure and functioning of the device according to the invention and the method according to the invention are then illustrated with reference to FIGS. 3-12. The decoding result of the device according to the invention is shown by comparison with the prior art in FIG. 13. The illustration and description of identical elements in similar drawings has not been repeated in some cases.

Figure 1:
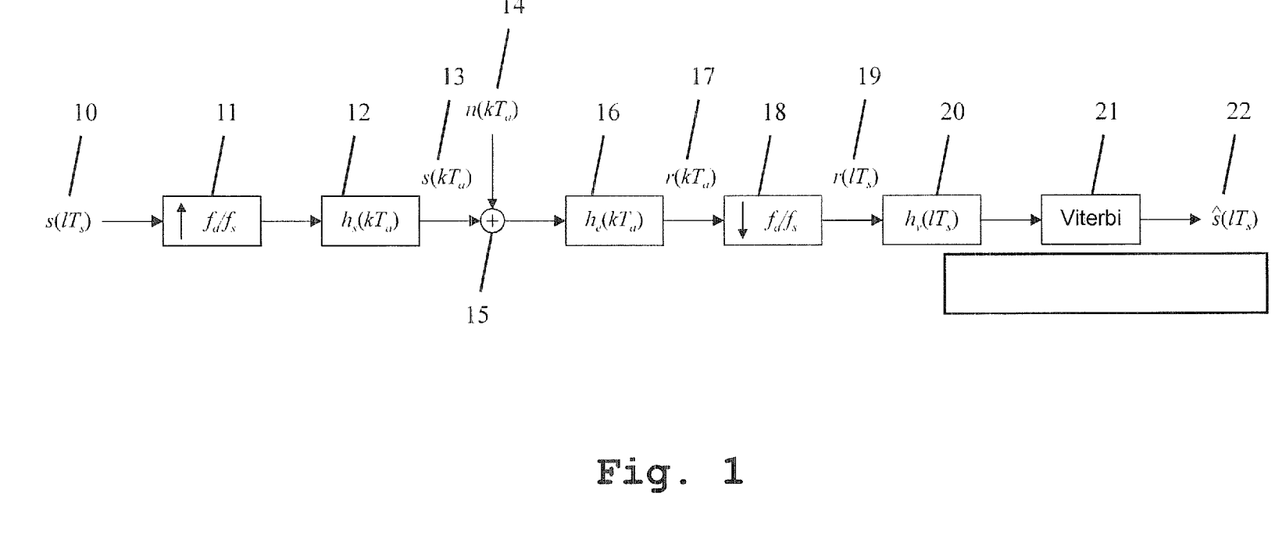
FIG. 1 shows a block-circuit diagram of a transmission and reception path of a convolution-encoded signal.

In FIG. 1, a block-circuit diagram of a transmission and reception path of a convolution-encoded signal is presented. The transmission symbol sequence $s(IT_s)$ 10 in the baseband is modulated through the modulation device 11 to the transmission frequency. The transmission filter 12 impresses its impulse response on the signal. The signal 13 is transmitted via the channel. The latter is modelled by additive white noise 14, which is added in an adder 15. At the reception end, the reception signal is filtered through a reception filter 16. The filtered reception signal 17 is demodulated by the demodulation device 18 to form a baseband signal 19. A decoding filter 20 conditions the signal 19, before the Viterbi decoder 21 decodes the signal to give the reception-signal sequence 22.

Figure 2:
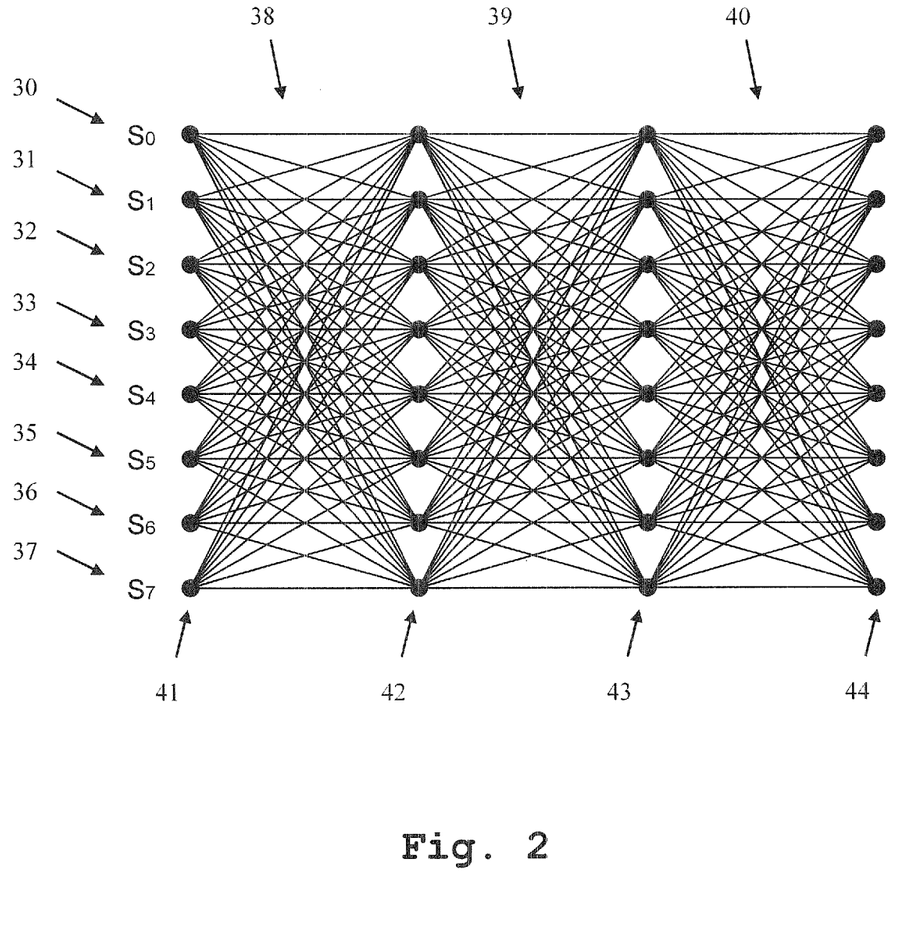
FIG. 2 shows an exemplary state diagram of a Viterbi decoder.

FIG. 2 shows an exemplary state diagram of a Viterbi decoder. The states 30-37 and their connection options 38-40 are presented over the timing points 41-44. In this context, each state 30-37 at a given timing point 41-44 is connected to each state 30-37 of the following timing point 41-44. The branch metric is calculated for every connection of the states. For this purpose, the Euclidean distance of the respective reception symbol to the individual reception symbols assigned to the branches is calculated. That is to say, 64 branch metrics are calculated for one state transition, and 192 branch metrics are calculated for the entire state diagram presented. Furthermore, the path metrics are calculated from the branch metrics. Since all of the paths of the entire state diagram are taken into consideration, 4096 path metrics are calculated. This already corresponds to a significant processing cost. Assuming a modulation scheme with more than 8 states, for example, 64 states, and a code memory of more than three past states, the decoding cost increases in orders of magnitude, which are no longer readily manageable.

Figure 3:
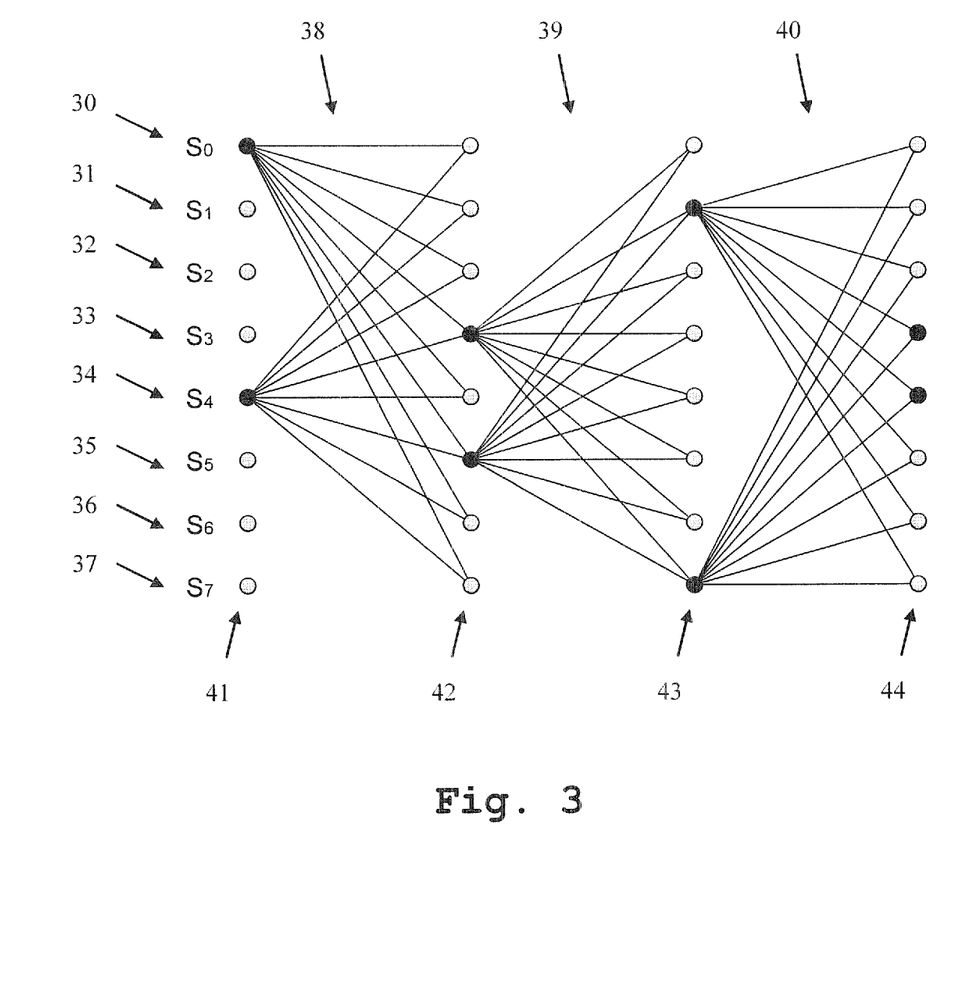
FIG. 3 shows an exemplary state diagram of a modified Viterbi decoder.

FIG. 3 shows an exemplary state diagram of a modified Viterbi-decoder. In this context, in order to reduce processing costs, after the calculation of the branch metrics and path metrics for one timing point, only the two paths of maximum probability, that is to say, of minimum metric, are pursued further. The other paths are eliminated. Accordingly, at timing point 41, only the paths extending from state 30 and 34 are pursued further. At timing point 42, only the paths extending from state 33 and 35 are pursued further. At timing point 43, only the paths extending from state 31 and 37 are pursued further. Accordingly, the processing cost can be reduced by orders of magnitude. However, the detection security is reduced as a result, because potentially-useful information is prematurely rejected. Cases, in which the correct reception symbol is disposed on an improbable and therefore eliminated path, are not decoded correctly, although sufficient information for this purpose may be contained in the reception signal.

Figure 4:
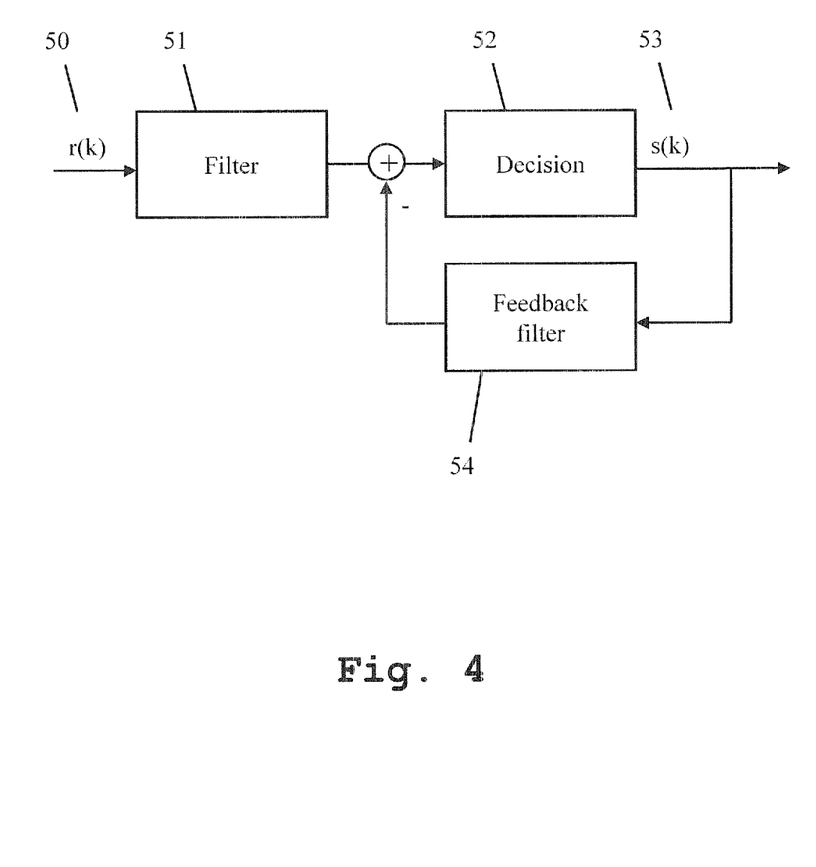
FIG. 4 shows a block-circuit diagram of an MMSE-DFE decoder.

FIG. 4 presents a block-circuit diagram of a "minimum mean-square-error decision-feedback equalizer" decoder (MMSE-DFE). Instead of taking into consideration the entire path of possible state transitions, with this type of decoder, every state is considered for itself and only the influence of past states is observed. For this purpose, a filter 51 initially provides a minimum-phase condition of the reception signal 50. That is to say, the influence of the present symbol on the reception signal is amplified, while the influence of the past symbols on the reception symbol is reduced. On the basis of the filtered signal and information from already-decoded symbols, the value of the present symbol 53 is decided in a decision unit 52. This value is fed back by means of a feedback filter 54 and subtracted from the output signal of the filter 51. Accordingly, an inter-symbol, interference-free signal is achieved at the decision unit 52. This decoder can be realised with very-low processing costs. At the same time, however, the bit-error probability is also sub-optimal here, because not all of the items of information available, which relate to the transmission signal, are used for the decoding.

Figure 5:
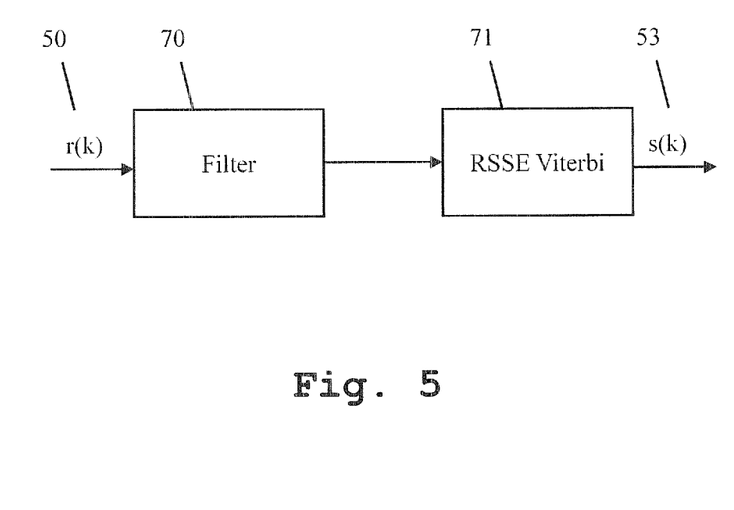
FIG. 5 shows a first block-circuit diagram of an exemplary embodiment of the device according to the invention.

In FIG. 5, a first block-circuit diagram of an exemplary embodiment of the device according to the invention is presented. The reception-symbol sequence 50 is filtered by a filter 70. The filter initially provides a minimum-phase condition of the reception signal 50. This process is explained in greater detail with reference to FIGS. 7 and 8. Following this, the signal is decoded by a modified Viterbi decoder 71, which outputs the decoded transmission symbol sequence 53. The structure and functioning of the modified Viterbi decoder are presented in greater detail with reference to FIG. 6.

Figure 6:
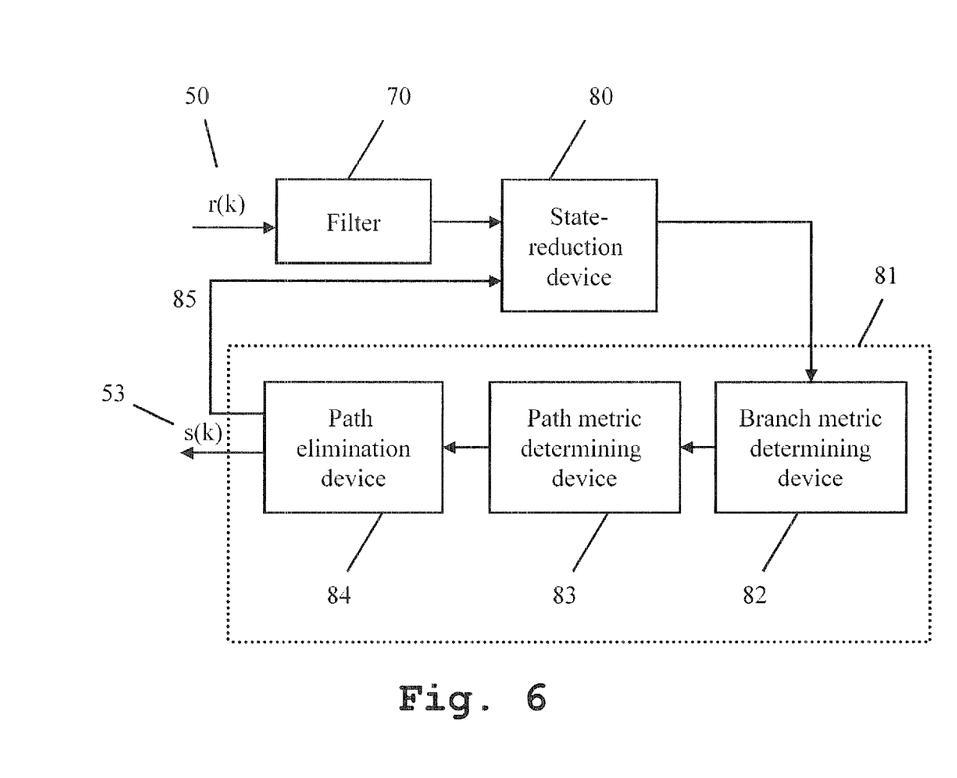
FIG. 6 shows a second block-circuit diagram of an exemplary embodiment of the device according to the invention.

FIG. 6 shows a second block-circuit diagram of an exemplary embodiment of the device according to the invention. As shown in FIG. 5, the reception-symbol sequence 50 is filtered by a filter 70 in order to provide a minimum-phase condition. This process is explained in greater detail with reference to FIGS. 7 and 8. Following this, the signal passes through a state-reduction device 80, which, with the assistance of already-decoded symbols 85, implements a reduction of the permitted, present symbols. For this purpose, weighted, decoded symbols are subtracted from the inter-symbol, interference-laden reception symbol. The resulting symbol is an inter-symbol, interference-free symbol.

From the position of this symbol in the modulation scheme of the convolution-encoded signal used, a given number of neighboring symbols, for example, in the case of phase modulation, two neighboring symbols, are determined as the sole permitted symbols. Together with the filtered input symbol sequence 50, the information relating to permitted states is routed to a branch-metric-determining device 82, which determines the metric exclusively for branches, which lead to one of the permitted symbols. The metrics of the permitted branches is routed to the path-metric-determining device 83. This calculates the path metrics of the permitted paths from the branch metrics of the permitted branches by addition. The path metrics are transferred to the path-elimination device 84, which selects the most probable path and eliminates the other paths. The remaining path directly provides the decoded symbols 53. In this context, the block 81 corresponds to a conventional Viterbi decoder.

Figure 7:
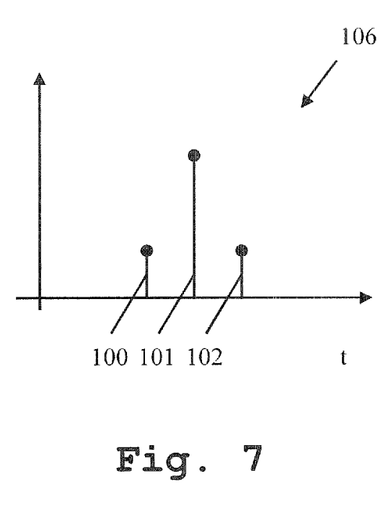
FIG. 7 shows the impulse response of an exemplary transmission filter for convolution-encoded signals.

FIG. 7 shows the impulse response of an exemplary transmission filter for convolution-encoded signals. The impulse response 106 of the exemplary transmission filter is composed of three components 100, 101, 102. The component 102 corresponding to the present symbol in this context is not the strongest component of the impulse response.

Figure 8:
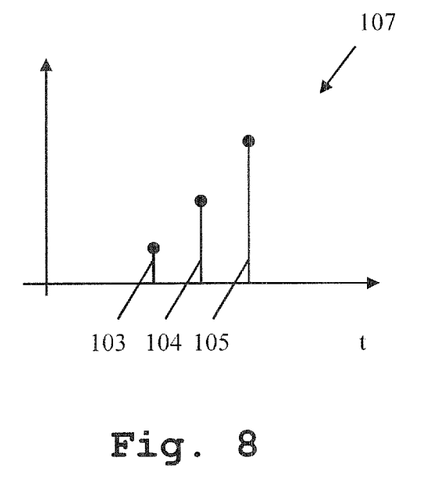
FIG. 8 shows the impulse response of an exemplary transmission filter for convolution-encoded signals converted through a filter at the reception end.

FIG. 8 shows the impulse response, transformed through a filter at the reception end, of an exemplary transmission filter for convolution-encoded signals. The filtered impulse response 107 of the exemplary transmission filter is composed of three components 103, 104, 105. The component 105 corresponding to the present symbol in this context is the strongest component of the impulse response.

Figure 9:
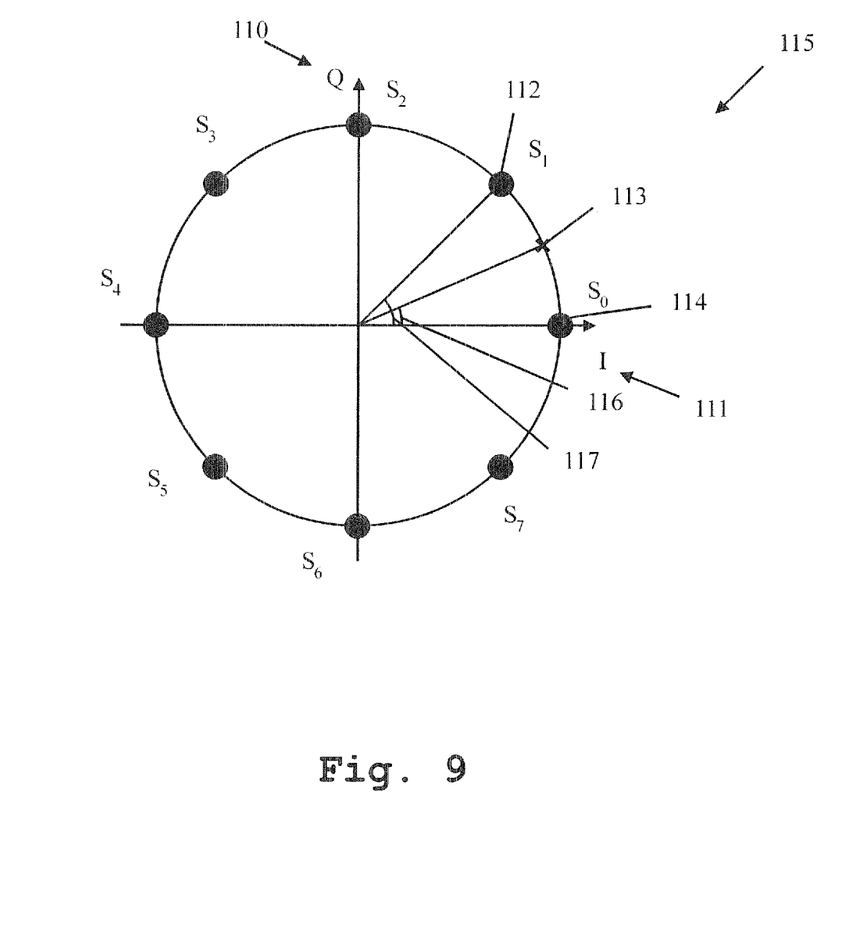
FIG. 9 shows a first exemplary modulation scheme.

FIG. 9 shows a first exemplary modulation scheme. The modulation scheme 115 presented here is an 8-stage phase modulation. The modulation stages $S_0$-$S_7$ correspond to the states of the decoding from FIGS. 2, 3. The modulation stages $S_0$-$S_7$ are formed by points on a unit circle in complex space, plotted by the in-phase components 111 and the quaternary components 110. Each modulation stage $S_0$-$S_7$ is characterised by a discrete phase angle. Accordingly, the modulation stage $S_1$, for example, is determined by the phase angle 117.

Every point on the unit circle in this context has two modulation stages as direct neighbors. Each further modulation stage alongside the two direct neighbors is considerably further removed. If the inter-symbol, interference-free symbol 113 is determined by the symbol-reduction device 80 from FIG. 6 with the phase angle 116, the two permitted symbols in this modulation scheme 115 are the modulation stages $S_0$ 114 and $S_1$ 112.

Figure 10:
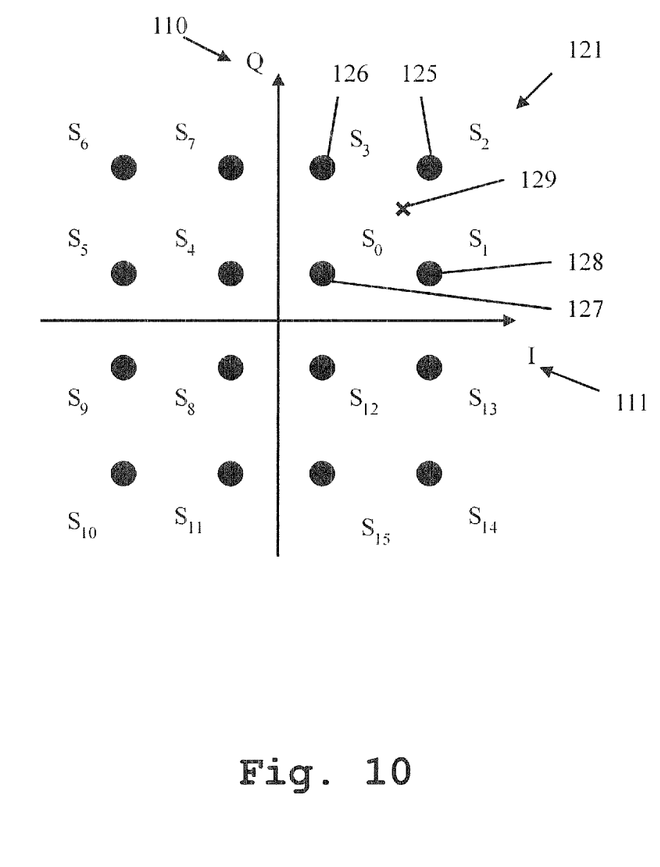
FIG. 10 shows a second exemplary modulation scheme.

In FIG. 10, a second exemplary modulation scheme is presented. The modulation scheme 120 presented here is a 16-stage quaternary amplitude modulation. In this context, 16 modulation stages $S_0$-$S_{15}$, are arranged in the complex space, plotted by the in-phase component 111 and the quaternary component 110. Each modulation stage $S_0$-$S_{15}$ is characterised by a discrete value of the in-phase component 111 and the quaternary component 110. On the basis of the arrangement of modulation stages $S_0$-$S_{15}$, four modulation stages are obtained as direct neighbors for every point within the modulation scheme 121 in the complex space. Every further modulation stage alongside the four direct neighbors is considerably further removed. If the inter-symbol, interference-free symbol 129 is determined through the symbol-reduction device 80 from FIG. 6, the four permissible symbols in this modulation scheme 121 are the modulation stages $S_0$ 127, $S_1$ 128, $S_2$ 125 and $S_3$ 126.

Figure 11:
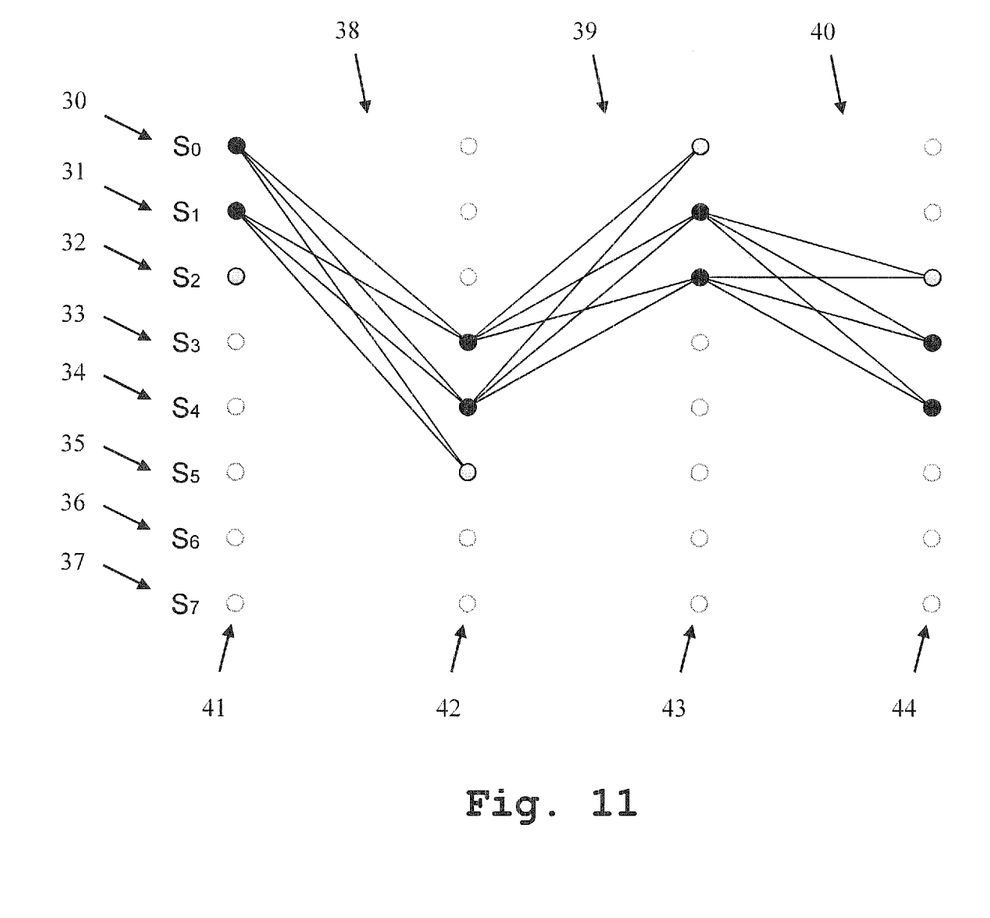
FIG. 11 shows an exemplary state diagram of a first exemplary embodiment of the decoder according to the invention.

FIG. 11 shows an exemplary state diagram of a first exemplary embodiment of the decoder according to the invention. The state diagram is now significantly simplified by comparison with the state diagrams from FIGS. 2 and 3. In this context, a reduction of the permissible consequential states to 3 is presented. At the same time, a reduction of the paths to be pursued to the two most probable is presented. Accordingly, a dramatically-reduced processing cost is achieved. Through the combination of the reduction of consequential symbols and the number of paths, the processing cost is reduced very considerably. The bit-error probability is increased by comparison with a complete analysis of all states and paths. However, the ratio of the bit-error rate by comparison with the processing cost is very much more favorable.

Figure 12:
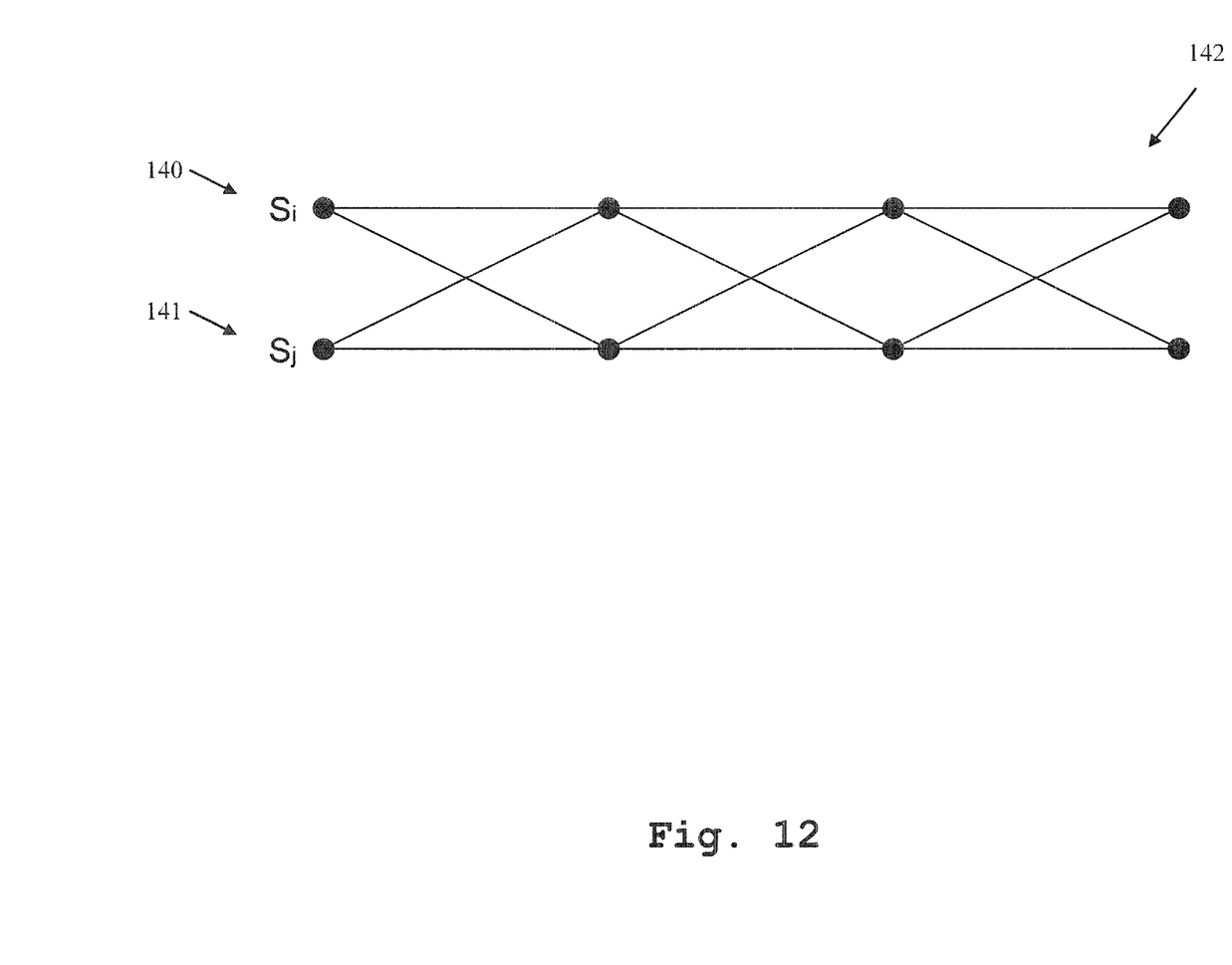
FIG. 12 shows an exemplary state diagram of a second exemplary embodiment of the decoder according to the invention.

In FIG. 12, an exemplary state diagram of a second exemplary embodiment of the decoder according to the invention is presented. Here also, a simplified state diagram 142 is presented. By limiting the permissible states to two permissible states 140 and 141 and the number of paths to two, a very small number of paths to be calculated is obtained.

Figure 13:
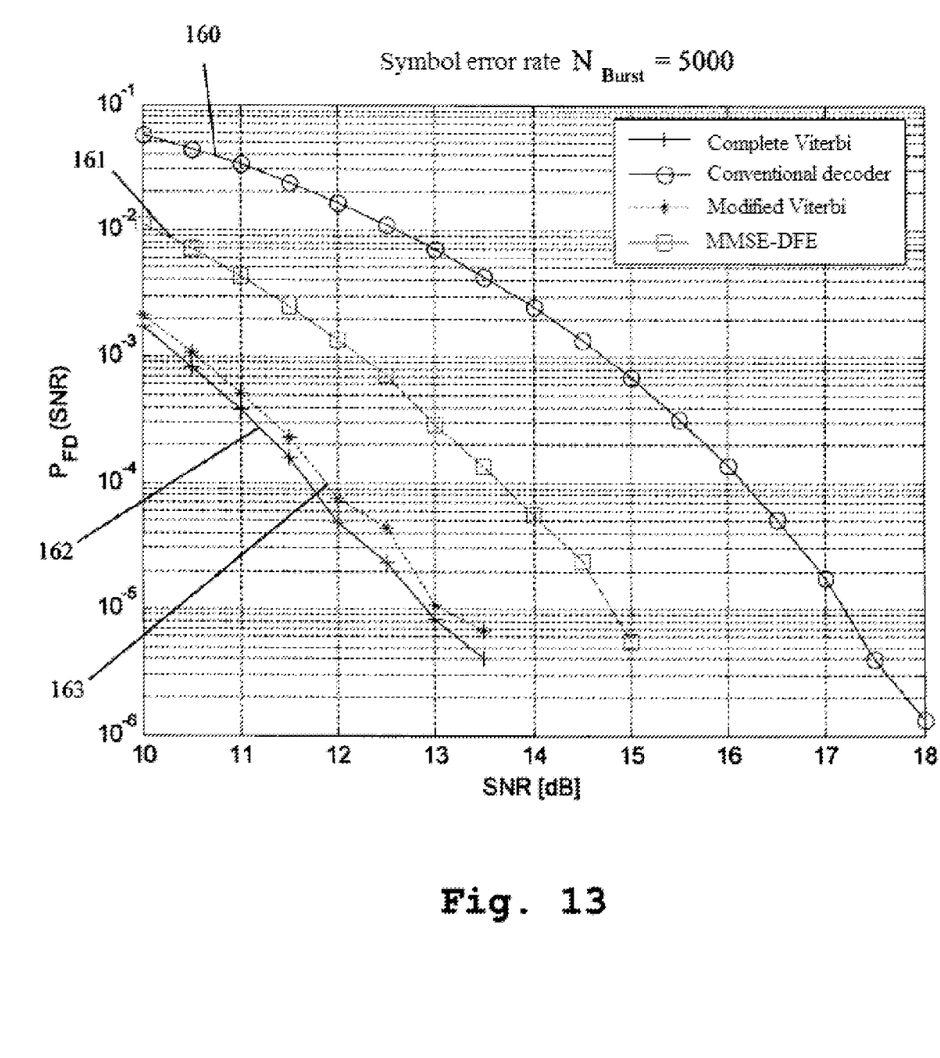
FIG. 13 shows a diagram of the resulting bit-error probabilities of various decoding methods.

FIG. 13 shows a diagram of the resulting bit-error probabilities of various decoding methods. The resulting bit-error rate with decoding with different decoders is presented against the signal-noise ratio. A conventional decoder 160, which does not balance inter-symbol interference, achieves only a very high bit-error rate. A better result is provided by the MMSE-DFE decoder presented in FIG. 4. A Viterbi decoder 162, which evaluates the complete state diagram, provides an optimum result. The modified Viterbi decoder 163 according to the invention, which, however, requires a substantially-lower processing cost than the complete Viterbi decoder, achieves a result which is only slightly poorer.

The invention is not restricted to the exemplary embodiment presented. As already mentioned, different types of convolution-based signals can be decoded. For example, a use in mobile telephony and also in the recovery of recorded data, for example, on hard disks, is conceivable. All of the features described above or the features illustrated in the drawings can be combined with one another as required within the framework of the invention.

The invention claimed is:

1. A method comprising:
    modulating transmission data with a modulation scheme to form symbols;
    encoding the symbols with a transmission filter to form convolution-encoded transmission symbols, wherein a convolution-encoded transmission symbol contains components of several symbols arranged in time succession:
    transmitting the transmission symbols via a transmission channel, wherein the transmitted transmission symbols are received as reception symbols; and
    decoding the reception symbols by means of a modified Viterbi algorithm, wherein independently of the decoding with the modified Viterbi algorithm, additional items of information, which relate to possible consequential states of the decoding, are determined in every state of the decoding,
    wherein the additional items of information are used to restrict further decoding to given consequential states,
    wherein additional knowledge relating to possible consequential states is obtained by determining an inter-symbol, interference-free, present reception symbol,
    wherein the inter-symbol, interference-free, present reception symbol is obtained by subtraction weighted with weighting factors of past inter-symbol, interference-free reception symbols from the present reception symbol,
    wherein the given consequential states are determined through states of minimum Euclidean distance to the inter-symbol, interference-free, present reception symbol, and wherein a modulation device carries out the modulating transmission data.

2. The method according to claim 1, wherein the modulation scheme is a phase modulation, and wherein the further decoding is restricted to two given consequential states.

3. The method according to claim 1, wherein the modulation scheme is an 8-stage phase modulation or a 16-stage phase modulation.

4. The method according to claim 1, wherein the modulation scheme is a quadrature-amplitude modulation, and wherein the further decoding is restricted to four given consequential states.

5. The method according to claim 1, wherein the modulation scheme is a 16-stage quadrature-amplitude modulation or a 32-stage quadrature-amplitude modulation or a 64-stage quadrature-amplitude modulation.

6. The method according to claim 1, wherein, in every state of the decoding with the Viterbi algorithm, at least one path is determined, which gives a correct sequence of transmission symbols with a low probability, and wherein this at least one path is eliminated from the further decoding.

7. The method according to claim 1, wherein the reception symbols are filtered before the decoding, wherein filtering reduces an influence of past symbols on the convolution-encoded reception symbol, and wherein the filtering increases an influence of the present reception symbol on the convolution-encoded reception symbol.

8. The method according to claim 7, wherein coefficients of the filtering and the weighting factors for determining the present, inter-symbol, interference-free reception symbol are determined through optimization.

9. A combination, comprising:
    a modulation device that modulates transmission data with a modulation scheme to form symbols;
    a transmission filter that encodes the symbols with a transmission filter to form convolution-encoded transmission symbols, wherein a convolution-encoded transmission symbol contains components of several symbols arranged in time succession;
    a transmission channel via which the transmission symbols are transmitted, wherein the transmitted transmission symbols are received as reception symbols;
    a Viterbi decoder that decodes the reception symbols by means of a modified Viterbi algorithm; and
    a state-reduction device that processes the reception symbols before running through the modified Viterbi decoder,
    wherein, independently from the decoding by the Viterbi decoder, in every state of the decoding, the state-reduction device determines additional items of information, which relate to possible consequential states of the decoding,
    wherein the state-reduction device uses the additional items of information in order to restrict the decoding by the Viterbi decoder to given consequential states,
    wherein the state-reduction device obtains additional knowledge relating to possible consequential states by determining an inter-symbol, interference-free, present reception symbol,
    wherein the state-reduction device obtains the inter-symbol, interference-free, present reception symbol through weighted subtraction of past inter-symbol, interference-free reception symbols from the present reception symbol, and
    wherein the state-reduction device determines the consequential states by determining states of minimum Euclidean distance to the inter-symbol, interference-free, present reception symbol.

10. The combination according to claim 9, wherein the modulation scheme is a phase modulation, and wherein the state-reduction device restricts further decoding to two given consequential states.

11. The combination according to claim 9, wherein the modulation scheme is an 8-stage phase modulation or a 16-stage phase modulation.

12. The combination according to claim 9, wherein the modulation scheme is a quadrature-amplitude modulation, and wherein the state-reduction device restricts further decoding to four given consequential states.

13. The combination according to claim 9, wherein the modulation scheme is a 16-stage quadrature-amplitude modulation or a 32-stage quadrature-amplitude modulation or a 64-stage quadrature-amplitude modulation.

14. The combination according to claim 9, wherein, in every state of the decoding with the Viterbi algorithm, the Viterbi decoder determines at least one path, which gives a correct sequence of transmission symbols with a low probability, and wherein the Viterbi-decoder eliminates this at least one path from further decoding.

15. The combination according to claim 9, wherein a filter filters the reception symbols before the decoding, wherein filtering through the filter reduces an influence of past symbols on an convolution-encoded reception symbol, and wherein the filtering through the filter increases an influence of the present reception symbol on the convolution-encoded reception symbol.

16. The combination according to claim 15, wherein coefficients of the filter and the weighting factors for determining the present, inter-symbol, interference-free reception symbol are determined through optimization.

* * * * *